United States Patent [19]

Rehfeldt

[11] 4,365,206
[45] Dec. 21, 1982

[54] DIFFERENTIAL AMPLIFIER

[75] Inventor: Karl H. Rehfeldt, Quickborn, Fed. Rep. of Germany

[73] Assignee: U.S. Philips Corporation, New York, N.Y.

[21] Appl. No.: 202,810

[22] Filed: Oct. 31, 1980

[30] Foreign Application Priority Data

Nov. 21, 1979 [DE] Fed. Rep. of Germany ....... 2946952

[51] Int. Cl.³ .............................................. H03F 3/45
[52] U.S. Cl. ..................................... 330/260; 330/252
[58] Field of Search ................ 330/258, 259, 260, 252

[56] References Cited

U.S. PATENT DOCUMENTS 3,304,512  2/1967  McMillan ........................... 330/260

Primary Examiner—James B. Mullins
Assistant Examiner—Gene Wan
Attorney, Agent, or Firm—Thomas A. Briody; William J. Streeter; Laurence A. Wright

[57] ABSTRACT

A low-pass transfer is effected between the two stages in an asymmetrically driven differential amplifier, which transfer has a negative effect on the high frequencies. The measure embodying the invention provides by means of a further transistor a negative feedback circuit which causes the low-pass filter to be of a low resistance or because of which it need only process low voltages. This greatly improves the transmission for high frequencies.

4 Claims, 2 Drawing Figures

DIFFERENTIAL AMPLIFIER

The invention relates to a differential amplifier in which two transistors are connected by means of their emitters, each one via an emitter resistor, to an impedance, for example a current source, the other side of which is connected to the first pole (ground) of a supply source and in which the bases are connected, each one via a current supply impedance to the second (+) pole of the supply source and in which control is effected by a signal applied to a base electrode, a symmetrical output signal being taken from a network which is incorporated in the collector branches of the transistors.

BACKGROUND OF THE INVENTION

In such a prior art differential amplifier which is driven asymmetrically, the emitter electrode of the first transistor is controlled by means of the base input voltage, and half of this control voltage is produced at the point in which the emitter resistors are connected to the current source; approximately the same alternating voltage is also produced at the emitter of the transistor which is not controlled via its base. Stray capacitances are usually operative at the said circuit points and in combination with the neighbouring impedances, particularly the emitter resistors and the transistor internal resistances, a low-pass effect is obtained from the first to the second transistor in such manner that higher frequencies are only transmitted in an attenuated manner. The second transistor is then driven with only a limited frequency, so that the frequency band of the signals taken from the output point of the two differential amplifier transistors is limited, and the signals are possibly not sufficiently symmetrical.

The invention has for its object to reduce to a considerable extent the narrowing down of the frequency band when higher frequencies are amplified.

SUMMARY OF THE INVENTION

According to the invention, this object is accomplished in that the collector-emitter path of a further transistor, whose base is connected to the junction point of the two emitter resistors is connected between the base branch of at least one transistor and the first pole of the supply source.

Only one additional transistor must be used, the collector of which is connected to the second pole of the supply source via a load impedance and to the base inputs of the differential amplifier transistor via current supply resistors.

Alternatively, two further transistors may be used whose bases are interconnected, and a collector-emitter path of each of these transistors being connected between the base and ground of the differential amplifier transistor.

In accordance with a further embodiment of the invention, a further current source circuit which is controlled by the signal may be arranged in series with one of the base current supply resistors. While, when driving the base, a lower input internal resistance is obtained with a differential amplifier according to the invention, the above-mentioned controlled current source may result in a higher input internal resistance.

BRIEF DESCRIPTION OF THE DRAWINGS

The invention will now be further explained by way of non-limitative example with reference to the drawing wherein.

DETAILED DESCRIPTION OF THE PREFERRED EMBODIMENTS

Figure 1:
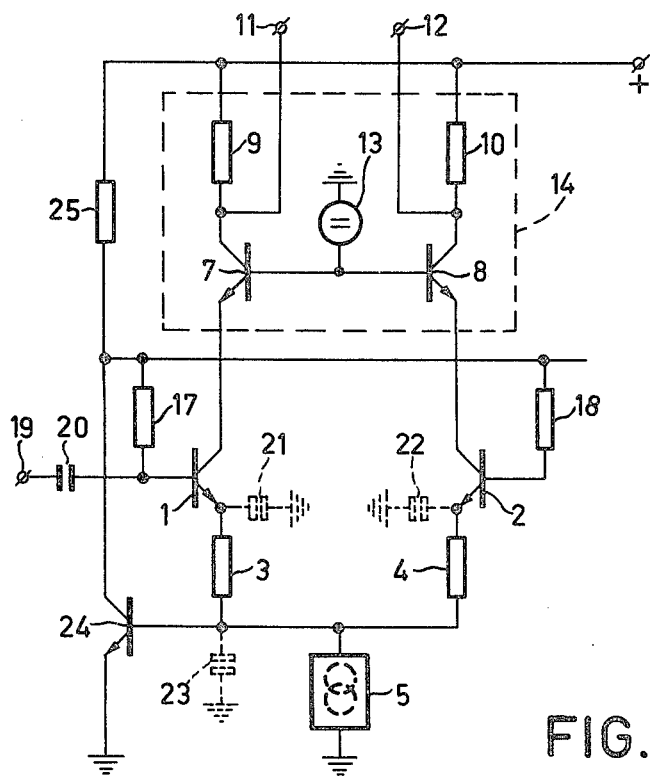
FIG. 1 shows a circuit according to the invention having a further transistor.

In FIG. 1, the npn transistors 1 and 2 form a differential amplifier. Their emitters are interconnected, each one via a resistor 3 and 4, respectively, each having a value of, for example, 500 Ohm and are connected to a current source 5, which is connected to the first pole of the supply source (ground). In a known manner, the current source 5 may be formed by another impedance which is highly resistive to the signal current. For example, the collector emitter path of a transistor to which a constant base emitter voltage is applied. Each collector branch of the transistors 1 and 2 is connected to the emitter of an npn transistor 7 and 8, respectively, whose collectors are connected via load resistors 9 and 10, respectively, to the + pole of the voltage source of, for example, 8 Volts. The symmetrical (balanced) output signal is taken from the collectors of the transistors 7 and 8 by means of the terminals 11 and 12. The bases of the transistors 7 and 8 are connected to a suitable direct voltage 13. In a known manner, transistors 7 and 8 form a cascade stage with emitter control, which because of a low input impedance is slightly sensitive to stray capacitances from, for example, the collectors of the transistors 1 and 2.

The elements 7 to 13 form an output network 14 for the differential amplifier 1, 2; it will be clear that alternatively a different network, for example with other amplifier stages and/or with filter elements may be used.

Each base electrode of transistors 1 and 2 is supplied with a setting current via a series resistor 17 and 18, respectively, each having a value of 100 kOhm. In a known circuit these resistors may be connected directly to the + pole of the supply source. The drive signal is fed forward from the terminal 19, for example via a coupling capacitor 20. In such a circuit stray capacitances, electrode capacitances or the like are operative, which are represented in FIG. 1 by broken line capacitors 21, 22 and 23 connected between the emitters of transistors 1 and 2 and between the junction point of emitter resistors 3 and 4, respectively, and ground. In the known circuit the signal voltage is produced at the emitter resistors 3 and 4 with approximately half the amplitude compared with the terminal 19, and the emitter resistors 3 and 4 and the current source form together with the effective capacitances a network which has a transfer characteristic which considerably decreases at higher frequency.

In accordance with the invention the circuit comprises a further transistor 24, the emitter of which is connected to ground, the base to the junction point of the resistors 3 and 4 and the collector to the base branch of the transistor 1. The 10 kOhm collector resistor 25 of transistor 24 is connected to the + pole of the supply source, and also connected to base current supply resistors 17 and 18.

Additional resistor 25 forms in combination with the transistor 1 a strong negative feedback circuit, which results in a lower input impedance. The required current drive of the transistor 1 and consequently of transistor 2 is therefore obtained with a lower voltage amplitude which is produced at the emitter resistors 3 and 4 with respect to ground. This causes stray capacitances 21, 22 and 23 to become correspondingly less effective. It was found that the bandwidth of the differential amplifier may be increased to double and to four times the value, respectively.

Figure 2:
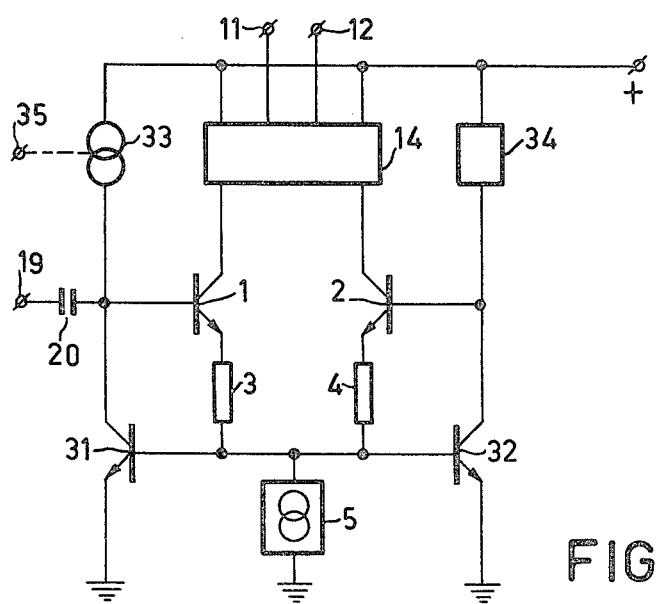
FIG. 2 shows a circuit according to the invention having two further transistors.

FIG. 2 shows another embodiment of the invention in which two transistors 31 and 32 are connected to the emitter resistors 3 and 4 by means of their bases and to ground by means of their emitters. Their collectors are connected to the bases of transistors 1 and 2 of the differential amplifier. Each base of transistors 1 and 2 is further connected to the positive pole + of the supply source via current supply impedances 33 and 34, respectively. As in FIG. 1, the amplifier is driven by means of the base of transistor 1 from a signal input terminal 19 via a capacitor 20. Capacitor 20 may be omitted when the direct voltage potential at terminal 19 is matched to the required input voltage of transistor 1. Consequently, two negative feedback circuits for the transistors 1 and 2 are formed in this circuit by transistors 31 and 32, which may result in a still further improved symmetry and a further increase of the bandwidth.

Current supply impedances 33 and 34 may be of any type. They may also particularly comprise filter networks. In view of the base current setting of the transistors 1 and 2, they must include corresponding elements for the direct current setting, for example, a resistor or a direct current source. The impedance 33 may alternatively be controlled from a terminal 35, so that it applies a signal current to the base of transistor 1. As a result thereof the amplifier can, if necessary, be driven at a higher impedance.

What is claimed is:

1. A differential amplifier comprising:
two transistors connected by means of their emitters, each of said transistors having an emitter resistor connected in series to a current source, the other side of said current source being connected to a ground terminal of a supply source, the bases of said transistors being connected by means of a current supply impedance to the positive terminal of said supply source, the control of said differential amplifier being effected by a signal applied to a base electrode of one of said two transistors;

a network circuit, a symmetrical output signal being taken from said network circuit which is connected to the collector-branches of said two transistors, and;

said differential amplifier further comprising a third transistor whose base is connected to the junction point of said emitter resistors of said two transistors, said third transistor being connected between the base branch of at least one of said two differentially connected transistors and the ground terminal of said supply source.

2. A circuit arrangement as claimed in claim 1, wherein the collector of said third transistor is connected to the positive terminal of said supply source by means of a load impedance and by means of current supply resistors to the base inputs of said two differentially connected transistors.

3. A circuit arrangement as claimed in claim 2, comprising a fourth transistor, the bases of said third and fourth transistors being interconnected and connected to the junction point of said emitter resistors of said differential amplifier, the collector and emitter of said fourth transistor being connected to the other base electrode of said differential amplifier and to ground respectively.

4. A circuit arrangement as claimed in claim 3, comprising a signal terminal connected to the base input of said differential amplifier and a second and third current source circuit connected in series between the bases of said differential amplifier and said supply source, said signal terminal also being connected to one of said second and third current source circuits for the control thereof.

* * * * *